(12) United States Patent
Hermann

(10) Patent No.: US 6,172,507 B1
(45) Date of Patent: Jan. 9, 2001

(54) CIRCUIT CONFIGURATION FOR MEASURING RESISTANCE AND LEAKAGE

(75) Inventor: Stefan Hermann, Köfering (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/272,962

(22) Filed: Mar. 19, 1999

Related U.S. Application Data

(63) Continuation of application No. PCT/DE97/01538, filed on Jul. 22, 1997.

(30) Foreign Application Priority Data

Sep. 19, 1996 (DE) .............................. 196 38 393

(51) Int. Cl.[7] .............................................. G01R 31/00
(52) U.S. Cl. .................... 324/502; 324/603; 324/550; 340/638
(58) Field of Search .......................... 340/638, 324/502, 324/550, 140 R, 141, 603, 142; 327/356, 357

(56) References Cited

U.S. PATENT DOCUMENTS

| 3,976,941 | * | 8/1976 | Milkovik | 324/142 |
| 5,497,077 | * | 3/1996 | Nukui | 324/142 |
| 5,726,901 | * | 3/1998 | Brown | 324/142 |

FOREIGN PATENT DOCUMENTS

| 195 17 141 A1 | 11/1996 | (DE) . |
| 0 398 824 A1 | 11/1990 | (EP) . |
| 0 689 058 A2 | 12/1995 | (EP) . |
| 0 701 928 A1 | 3/1996 | (EP) . |

OTHER PUBLICATIONS

"Detection of Shorted Components in Parallel Circuits", Technical Disclosure Bulletin, vol. 17, No. 9, Feb. 1975.

* cited by examiner

*Primary Examiner*—Safet Metjahic
*Assistant Examiner*—Jose Solis
(74) *Attorney, Agent, or Firm*—Herbert L. Lerner; Laurence A. Greenberg; Werner H. Stemer

(57) ABSTRACT

A circuit configuration for measuring resistance and/or leakage between two nodes, which includes a current source for feeding a test current into one of the two nodes and a circuit element that detects the voltage resulting between the two nodes. The output of a broadband signal generator is connected to a control input of the current source. The outputs of the circuit element and of the signal generator are connected to the inputs of the correlator for determining the correlation between their output signals.

7 Claims, 2 Drawing Sheets

CIRCUIT CONFIGURATION FOR MEASURING RESISTANCE AND LEAKAGE

CROSS-REFERENCE TO RELATED APPLICATION

This is a continuation of copending International Application PCT/DE97/01538, filed Jul. 22, 1997, which designated the United States.

BACKGROUND OF THE INVENTION

Field of the Invention

The invention relates to the field of electronic circuits, and specifically to a circuit configuration for measuring the resistance and/or leakage between two electrical nodes in an airbag control device.

Measurements of resistance and leakage resistance are frequently carried out by direct-current measurements. Since it is necessary to ensure an adequate signal/noise ratio, measurements are taken at high signal levels. This results in undesirably high electromagnetic radiation. Further, the required generators having a direct-current component and the required amplifiers are very expensive.

European Patent application EP A 0 689 058 discloses a circuit for monitoring an electrical circuit node for a fault condition in the form of a leakage resistance. The disclosed test configuration has a current source that is coupled to the node and an analyzer that has at least one comparator. A test current in the form of a direct current having a predetermined value is applied to one terminal of the circuit and only flows when the voltage between the node and the terminal drops below a predetermined limit value. Transgression of this voltage limit value by a leakage current leads to a change in the voltage at the comparator. A window comparator is preferably used to monitor the node for a leakage resistance with respect to each of two terminals of the circuit and a second current source having an opposite test current is provided.

German Patent Application DE-A 195 17 141 discloses a circuit for monitoring a priming-cap resistance of an airbag control device. A test current is alternately fed into the priming-cap resistance from mutually opposite directions. Each voltage value measured across the resistance is differentially amplified together with a positive reference voltage. A difference between the amplified voltages is calculated which is equal to a voltage value which would be caused by a test current having twice the level.

SUMMARY OF THE INVENTION

It is accordingly an object of the invention to provide a circuit for measuring resistance and leakage at low signal levels that can be constructed in a simple and inexpensive manner.

With the foregoing and other objects in view there is provided, in accordance with the invention, a circuit for measuring resistance between at least two circuit nodes in an airbag control device, comprising:

a current source for feeding a test current into one of two circuit nodes, the current source having a control input;

a circuit element connected between the two circuit nodes having an output dependent upon a voltage between the two circuit nodes resulting from the test current;

a broadband signal generator having an output electrically connected to the control input of the current source; and a correlator having a first input electrically connected to the output of the circuit element and a second input electrically connected to the output of the broadband signal generator, the correlator providing an output signal dependent upon a correlation between the output of the circuit element and the output of the broadband signal generator.

In accordance with an added feature of the invention, the circuit element includes a voltage amplifier.

In accordance with an additional feature of the invention, the voltage amplifier includes an operational amplifier.

In accordance with another feature of the invention, the broadband signal generator includes a digital signal generator.

In accordance with a further added feature of the invention, the signal generator includes a feedback-type register having a register length and a clock frequency.

In accordance with a further additional feature of the invention, the circuit for measuring resistance between at least two circuit nodes in an airbag control device includes:

a further current source for feeding a test current into at least one additional circuit node, the further current source having a control input;

a further circuit element connected between one of the two circuit nodes and the additional circuit node, and having an output dependent upon a voltage between one of the two circuit nodes and the additional circuit node resulting from the test current; and a further correlator having a first input electrically connected to the output of the circuit element, and a second input electrically connected to the output of the broadband signal generator, the correlator providing an output signal dependent upon a correlation between the output of the circuit element and the output of the broadband signal generator.

In accordance with yet an added feature of the invention, the signal generator is constructed to simultaneously provide uncorrelated signals to respective control inputs of the current source and the further current source and to respective second inputs of the correlator and the further correlator.

With the foregoing and other objects in view there is provided, in accordance with the invention, a circuit for obtaining a two-point measurement, comprising:

a multiplier having an output for obtaining a two-point measurement, the multiplier having a first input, and a second input provided with a signal representing a scaling factor; and a signal generator having an output connected to the first input of the multiplier.

The inventive circuit provides a broadband signal generator that impresses an alternating-current signal into the current source. This dispenses with elaborate generators and amplifiers having a direct-current component and therefore, reduces circuit costs. In addition, measurement using a broadband signal prevents high electromagnetic radiation and provides low electromagnetic sensitivity.

It is possible to use an analog signal generator, for example a random-number generator with analog values and a digital/analog converter. Preferably, however, a digital signal generator is provided that has less circuit complexity and, for example, outputs +1 and −1 signal levels. One possible implementation is a feedback-type register having a length n and clock frequency F. With the aforementioned register, the bandwidth of the signal can be between F and F/(2n−1).

The clocked output signal of the signal generator is applied to the current source which corresponding outputs alternating current signals. The voltage drop generated by these alternating current signals is detected by a voltage amplifier connected between the two nodes and is supplied to a correlator.

The principle of the circuit configuration according to the invention is as follows. In the ideal case, where no leakage is present and no foreign signals are present in the circuit section investigated, the pure undamped test signal with the impressed generator signal is obtained at the amplifier. The correlator receives the output of the amplifier and an unaltered signal from the generator. Thus, a 100% correspondence is obtained between the signal measured by the amplifier and the unaltered generator signal applied to the correlator, and a signal having a maximum level at the output of the correlator is provided.

The correlator examines the time-shifted signal values and suppresses uncorrelated signal values. Foreign signals such as, for example, statistically independent noise signals are removed and only the signal component coming from the current source signal is taken into consideration. If pure interference signals are input into the correlator, this results in a correspondence of 0% with the generator signal and a signal having a minimum level at the output of the correlator is provided.

If there is a leakage and no interference signals, an output signal having a high level is obtained since there is a correlation with the current source signal. In the case of leakage and simultaneous interference signals, however, a signal with a low level is obtained at the output of the correlator.

The correlator, for example, can be constructed with a multiplier followed by a low-pass filter. The two input signals, the correlation of which is to be tested, are multiplied by the multiplier. In the subsequent filter, an integration up to the cut-off frequency is performed and the interference components are filtered out.

The inventive circuit is especially useful with an airbag control device. It can be used, for example, for measuring the priming-cap resistance. Furthermore, leakage currents in the triggering circuit can be found, i.e. a leakage measurement can be performed between the priming cap and earth and between the priming cap and the battery voltage terminal. If desired, a distinction between a leakage to the ground terminal and to the battery voltage terminal need not be determined. A circuit used with an airbag control device would then only require two sets of measuring parts, i.e. two correlators, two current sources, etc.

The measurements of priming-cap resistance and leakage resistances can be performed simultaneously if in each case uncorrelated generator signals are present. This makes it possible to measure the priming-cap resistance and/or the leakage resistances simultaneously with respect to the earth terminal and the battery voltage terminal. In such a case, the generator signals are then shifted in time, e.g. from different register outputs. If only one generator signal is used, the measurements must be taken successively in time.

The inventive circuit configuration enables the performance of a continuous resistance and/or leakage resistance measurement. Because broadband signals are used, the circuit configuration is less sensitive to interference than in the case of direct-current measurements.

If increased measurement accuracy is desired, a two-point measurement can be performed. In this case, different currents are fed in. For example, the signal supplied to the current source from the signal generator can be multiplied by different factors for this purpose. The resistance R can then be obtained by solving the following equation, where U is the voltage and I is the current:

$$R=(U_2-U_1)/(I_2-I_1).$$

Such a two-point measurement makes it possible to eliminate the influence of, for example, an offset voltage.

Other features which are considered as characteristic for the invention are set forth in the appended claims.

Although the invention is illustrated and described herein as embodied in a circuit configuration for measuring resistance and leakage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
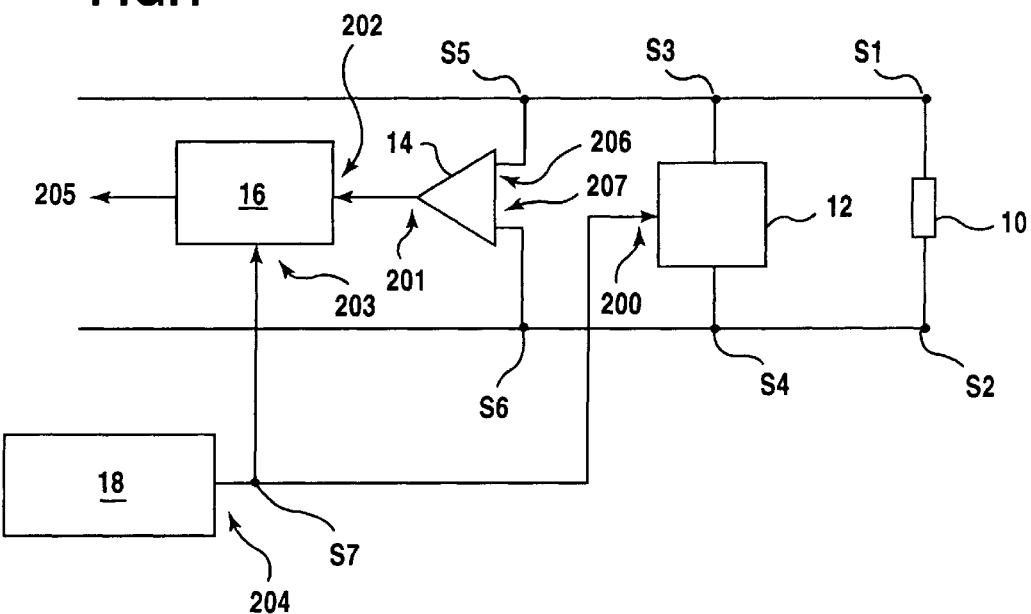
FIG. 1 is a block diagram of a first illustrative embodiment of a circuit configuration according to the invention.

The invention is a circuit for measuring resistance and/or leakage in airbag control devices. FIG. 1 is a block diagram showing the basic circuit configuration. Circuit section 10 represents the resistance to be measured which includes nodes S1 and S2. Nodes S1, S3, and S5 are electrically connected together, and nodes S2, S4, and S6 are electrically connected together. A current source 12 is connected in parallel between nodes S3 and S4. The current source 12 has a control input 200 for its activation. The inputs 206, 207 of an amplifier 14 are connected between nodes S5 and S6. The output 201 of the amplifier 14 is connected to a first input 202 of a correlator 16. The output 205 of the correlator 16 is connected to an analysis unit that is not shown. The output 204 of a broadband signal generator 18 is connected to a second input 203 of the correlator 16 and to the control input 200 of the current source 12.

The signal generator 18 causes current to flow from the current source 12 (e.g. 20 mA). The current does not have a direct-current component and flows through the circuit section 10 to be tested, thereby causing a voltage drop between nodes S1 and S2. The amplifier 14 detects the voltage drop and provides an output signal 201 to the first input 202 of the correlator 16. The second input 203 of the correlator 16 is supplied with the output signal 204 of the signal generator 18.

If the correlator 16 receives, in addition to the output signal 204 of the signal generator 18, a voltage signal 201 which contains the test component (derived from the signal generator 18), the correlator 16 finds a correlation and outputs a corresponding correlation signal, for example having a high level. If the test component is not present, the correlation signal has a low level.

Figure 2:
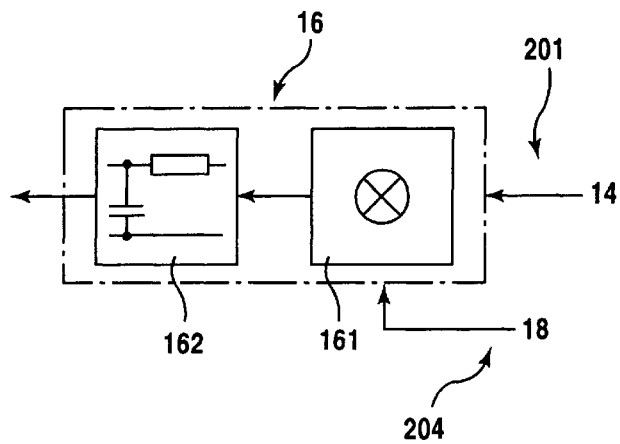
FIG. 2 is a block diagram of an example of a correlator used in the circuit configuration shown in FIG. 1.

FIG. 2 is a block diagram illustrating an example of a correlator 16 that can be used in the circuit shown in FIG. 1. It includes a multiplier 161 that multiplies the output 201 of the amplifier 14 with the output 204 of the broadband signal generator 18. It also includes a filter 162 that performs an integration over time of the product obtained from the multiplier 161. In the example shown, a low-pass filter is illustrated. The calculation can also be performed in a familiar manner in the frequency domain.

Figure 3:
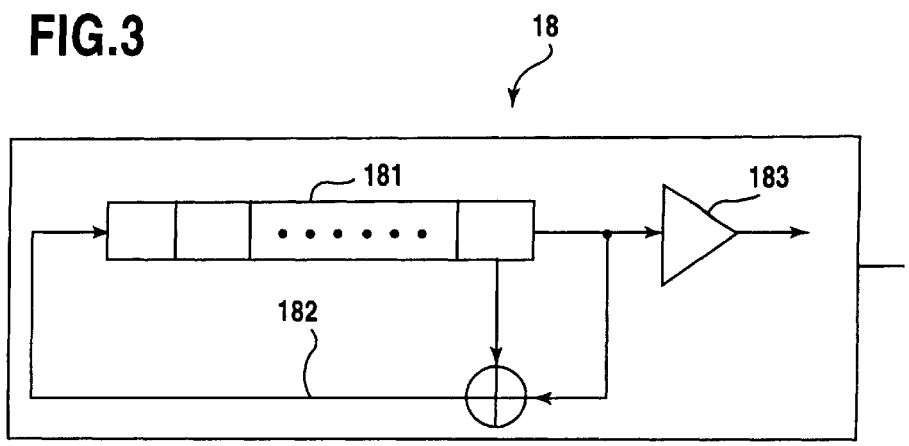
FIG. 3 is a block diagram of an example of a signal generator used in the circuit shown in FIG. 1.

FIG. 3 is a block diagram showing an example of a signal generator 18 which is advantageously used in the circuit shown in FIG. 1. It comprises an n-digit register 181 (e.g. n=8), with a feedback branch 182 (positive feedback) and operates with a clock frequency F. In the example shown, the clock frequency is 10 kHz. However, the invention is in no way restricted to this frequency or to this frequency range. The register output signal is amplified with an amplifier 183. The signal generator 18 is preferably a digital chip that outputs, for example, +1 and −1 signals.

Figure 4:
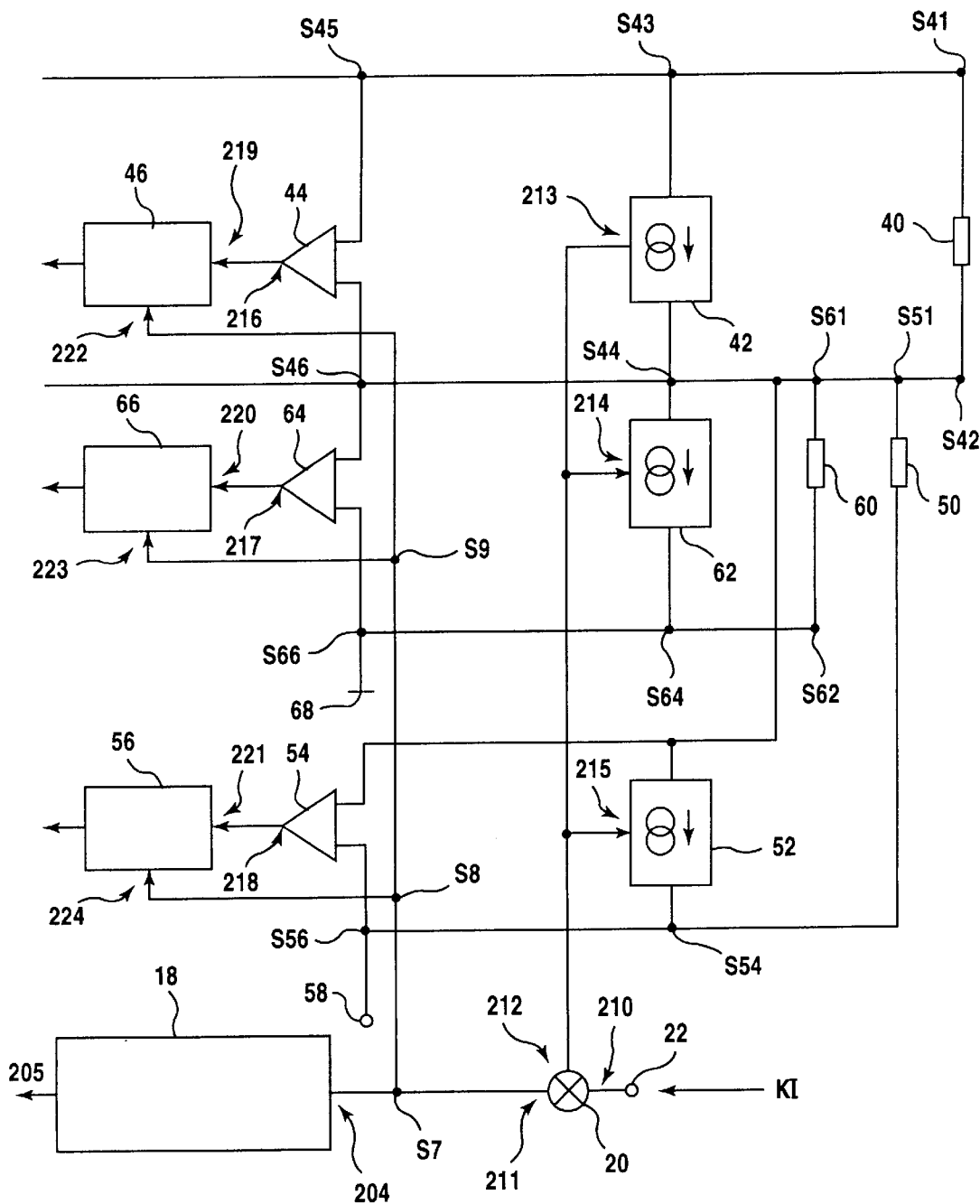
FIG. 4 is a block diagram of a second illustrative embodiment of a circuit configuration according to the invention.

FIG. 4 is a block diagram showing an illustrative application of the circuit configuration for use in an airbag control device. The block diagram essentially includes three of the circuit configurations shown in FIG. 1, however, only one signal generator 18 is utilized. The resistance to be measured is in one instance the priming-cap resistance 40 and in the other two cases a leakage resistance 50, 60 with respect to the battery potential or ground potential. Current sources 42, 52 and 62, circuit elements or amplifiers 44, 54 and 64 and correlators 46, 56 and 66 are provided in the same manner as in the circuit shown in FIG. 1. Outputs 216, 217, and 218 of respective circuit elements or amplifiers 44, 64, and 54 are connected to respective first inputs 219, 220, and 221 of correlators 46, 66, and 56. The leakage resistance 50 is measured between the low side of the priming cap resistance 40 at node S42 and the battery potential at battery terminal 58. The leakage resistance 60 is measured between the low side of the priming cap resistance 40 at node S42 and ground potential at ground terminal 68. Nodes S51, S53, S54, S56 and S58, S61, S62, S64, S66 and S68 are drawn for the sake of clarity.

The output 204 of the signal generator 18 is provided to respective second inputs 222, 223, and 224 of correlators 46, 66 and 56 via nodes S7, S8 and S9. The output 204 of the signal generator 18 is also connected to a first input 211 of a multiplier 20. Furthermore, the output 204 of the signal generator 18 is also connected to the respective control inputs 213, 215, and 214 of the current sources 42, 52 and 62 through the multiplier 20. The second input 210 of the multiplier 20 is supplied with a signal KI from a control input 22. The signal KI is a scaling factor and represents, for example, a factor of 1 or 2 (KI=1 or=2). Using the factor KI makes it possible to generate current source signals of different levels and thus enables a two-point measurement for increasing the measurement accuracy. The output 204 of signal generator 18 is simultaneously applied to all of the correlators 46, 56, and 66 and through the multiplier 20 to all of the current sources 42, 52, and 62. This makes it possible to carry out a leakage test simultaneously and cyclically and the current sources only need to be activated during these periods of time.

If no distinction needs to be made between the battery potential and the ground potential during the leakage current measurement, a circuit branch 52, 54, 56 or 62, 64, 66 can be omitted.

I claim:

1. A circuit for measuring resistance between at least two circuit nodes in an airbag control device, comprising:

a current source for feeding a test current into one of two circuit nodes, said current source having a control input;

a circuit element connected between the two circuit nodes having an output dependent upon a voltage between the two circuit nodes resulting from the test current;

a broadband signal generator having an output electrically connected to said control input of said current source; and a correlator having a first input electrically connected to said output of said circuit element and a second input electrically connected to said output of said broadband signal generator, said correlator providing an output signal dependent upon a correlation between said output of said circuit element and said output of said broadband signal generator.

2. The circuit according to claim 1, wherein said circuit element includes a voltage amplifier.

3. The circuit according to claim 2, wherein said voltage amplifier includes an operational amplifier.

4. The circuit according to claim 1, wherein said broadband signal generator includes a digital signal generator.

5. The circuit according to claim 4, wherein said signal generator includes a feedback-type register having a register length and a clock frequency.

6. The circuit according to claim 1, further comprising:

a further current source for feeding a test current into at least one additional circuit node, said further current source having a control input;

a further circuit element connected between one of the two circuit nodes and the additional circuit node, and having an output dependent upon a voltage between one of the two circuit nodes and the additional circuit node resulting from the test current; and a further correlator having a first input electrically connected to said output of said circuit element, and a second input electrically connected to said output of said broadband signal generator, said correlator providing an output signal dependent upon a correlation between said output of said circuit element and said output of said broadband signal generator.

7. The circuit according to claim 6, wherein said signal generator is constructed to simultaneously provide uncorrelated signals to respective said control inputs of said current source and said further current source and to respective said second inputs of said correlator and said further correlator.

* * * * *